(12) United States Patent
Kwasniewski et al.

(10) Patent No.: US 7,675,332 B1
(45) Date of Patent: Mar. 9, 2010

(54) FRACTIONAL DELAY-LOCKED LOOPS

(75) Inventors: Tad Kwasniewski, Ottawa (CA);
Farhad Zarkeshvari, Durham, NC (US)

(73) Assignee: Altera Corporation, San Jose, CA (US)

( * ) Notice: Subject to any disclaimer, the term of this patent is extended or adjusted under 35 U.S.C. 154(b) by 290 days.

(21) Appl. No.: 11/669,845

(22) Filed: Jan. 31, 2007

(51) Int. Cl.
*H03L 7/06* (2006.01)
(52) U.S. Cl. ...................... 327/158; 327/149
(58) Field of Classification Search ............... None
See application file for complete search history.

(56) References Cited

U.S. PATENT DOCUMENTS

| | | | |
|---|---|---|---|
| 5,052,031 A | | 9/1991 | Molloy |
| 5,463,337 A | * | 10/1995 | Leonowich ............... 327/158 |
| 5,883,534 A | * | 3/1999 | Kondoh et al. ............ 327/156 |
| 5,970,110 A | | 10/1999 | Li |
| 6,005,420 A | * | 12/1999 | Yoshizawa et al. ......... 327/116 |
| 6,087,864 A | * | 7/2000 | Aoki ...................... 327/116 |
| 6,147,525 A | * | 11/2000 | Mitani et al. ............. 327/119 |
| 6,680,634 B1 | * | 1/2004 | Ruha et al. ............... 327/158 |
| 6,686,805 B2 | | 2/2004 | Cyrusian |
| 6,707,330 B2 | * | 3/2004 | Nakanishi ................ 327/158 |
| 6,784,707 B2 | * | 8/2004 | Kim et al. ................ 327/158 |
| 6,956,407 B2 | | 10/2005 | Baig et al. |
| 6,970,020 B1 | | 11/2005 | Mei et al. |
| 7,061,334 B1 | | 6/2006 | Baig et al. |
| 7,084,682 B2 | | 8/2006 | Jeon et al. |
| 7,102,403 B2 | * | 9/2006 | Wang ..................... 327/158 |
| 7,109,766 B2 | | 9/2006 | White et al. |
| 7,154,978 B2 | * | 12/2006 | Juan et al. ................ 375/376 |
| 7,197,102 B2 | * | 3/2007 | Rhee et al. ............... 375/376 |
| 7,254,208 B2 | * | 8/2007 | Tomerlin et al. .......... 375/373 |
| 7,292,079 B2 | * | 11/2007 | Huang et al. ............. 327/158 |
| 7,295,053 B2 | * | 11/2007 | Lesso .................... 327/158 |
| 7,436,265 B2 | * | 10/2008 | Park et al. ................ 331/18 |
| 2002/0057118 A1 | * | 5/2002 | Tang ..................... 327/158 |
| 2004/0257124 A1 | * | 12/2004 | Araki et al. .............. 327/101 |
| 2006/0133559 A1 | | 6/2006 | Glass |

OTHER PUBLICATIONS

Dorin Emil Calbaza, et al., "Direct Digital Frequency Synthesis of Low-Jitter Clocks," IEEE Journal of Solid-State Circuits, vol. 36, No. 3, March 2001, pp. 570-572.

Y.-C. Bae and G.-Y. Wei, "A Mixed PLL/DLL Architecture for Low Jitter Clock Generation", IEEE International Symposium on Circuits and Systems, May 2004, pp. 788-791.

F. Zarkeshvari, T. Kwasniewski, "Analog DLL-Based Period Synthesis Circuit", Proc. International Conference on Communication, Circuit and Systems, vol. 2, pp. 1095-1098, Hong Kong, May 2005.

F. Zarkeshvari, P. Noel, T. A. Kawasniewski, "On ΔΣ Fractional-N Frequency Synthesizers"International Symposium on Signals, Circuits and Systems, ISSCS Jul. 14-15, 2005, Iasi, Romania, pp. 509-512.

(Continued)

*Primary Examiner*—Cassandra Cox
(74) *Attorney, Agent, or Firm*—Steven J. Cahill

(57) ABSTRACT

Phase detection circuitry in a delay-locked loop compares a periodic input signal to a feedback signal. The phase detection circuitry generates a delay signal that controls delays of the delay circuits. Two or more output signals of the delay circuits are transmitted to an input of the phase detection circuitry. The delay-locked loop can be configured so that the period of the periodic input signal divided by a delay of one of the delay circuits equals a non-integer rational number when the phase and frequency of the periodic input signal are constant. A frequency multiplier can be coupled to the delay circuits to generate a periodic output signal. The periodic output signal has an average frequency that is a product of the frequency of the periodic input signal multiplied by a fractional non-integer number when the phase and frequency of the periodic input signal are constant.

30 Claims, 11 Drawing Sheets

OTHER PUBLICATIONS

F. Zarkeshvari, P. Noel, T. A. Kawasniewski, "PLL-Based Fractional-N Frequency Synthesizers", Proceedings of the 9th International Database Engineering & Application Symposium, 2005, pp. 1-7.

P. Noel, F. Zarkeshvari, T. A. Kawasniewski, "Recent Advances in High-Speed Serial I/O Trends, Standards and Techniques", Canadian Conference on Electrical and Computer Engineering, IEEE CCECE05, Saskatoon, May 2005, pp. 1292-1295.

Dorin Emil Calbaza, Yvon Savaria, "Direct Digital Frequency Synthesis of Low-Jitter Clocks," IEEE Journal of Solid-State Circuits, vol. 36, No. 3, Mar. 2001, pp. 570-572.

* cited by examiner

FRACTIONAL DELAY-LOCKED LOOPS

BACKGROUND OF THE INVENTION

The present invention relates to electronic circuits, and more particularly, to delay-locked loops.

A backplane is a circuit board that is used to connect printed circuit board cards together to make up a complete computer system. Data transmitted in backplane data communications systems is controlled by a clock signal that is generated by a clock generator. A clock generator can be implemented using a frequency synthesizer that can generate a range of clock signal frequencies. A frequency synthesizer is typically based on a phase-locked loop (PLL).

Current implementations of frequency synthesizers typically have a PLL circuit that includes a voltage controlled oscillator (VCO). In many applications, a frequency synthesizer is required to comply with stringent jitter specifications. As a result, the design of the PLL has to be very well isolated from on-chip supply noise. Also, the PLL should have a high-quality VCO to minimize jitter. However, most high-quality VCO's consume a large amount of power and a large amount of silicon die area.

Alternatively, a frequency synthesizer can be based on a delay-locked loop (DLL). DLL-based frequency synthesizers provide exceptional phase noise performance. However, a DLL frequency synthesizer can only generate an output frequency that is the product of an integer times the frequency of an input reference clock signal.

Therefore, it would be desirable to provide a low noise frequency synthesizer that can provide a periodic output signal having a frequency that is the product of an input signal frequency and a fractional number.

BRIEF SUMMARY OF THE INVENTION

The present invention provides techniques for generating signals with fractional delay-locked loops. Phase detection circuitry in a delay-locked loop compares a periodic input signal to a feedback signal. The phase detection circuitry generates a delay signal that controls delays of the delay circuits. Two or more output signals of the delay circuits are transmitted to an input of the phase detection circuitry. The delay-locked loop can be configured so that the period of the periodic input signal divided by a delay of one of the delay circuits equals a non-integer rational number when the phase and frequency of the periodic input signal are constant.

According to further embodiments of the present invention, a frequency multiplier coupled to the delay circuits generates a periodic output signal. The periodic output signal has an average frequency that is a product of the frequency of the periodic input signal multiplied by a fractional non-integer number when the phase and frequency of the periodic input signal are constant.

Other objects, features, and advantages of the present invention will become apparent upon consideration of the following detailed description and the accompanying drawings.

DETAILED DESCRIPTION OF THE INVENTION

Figure 1:
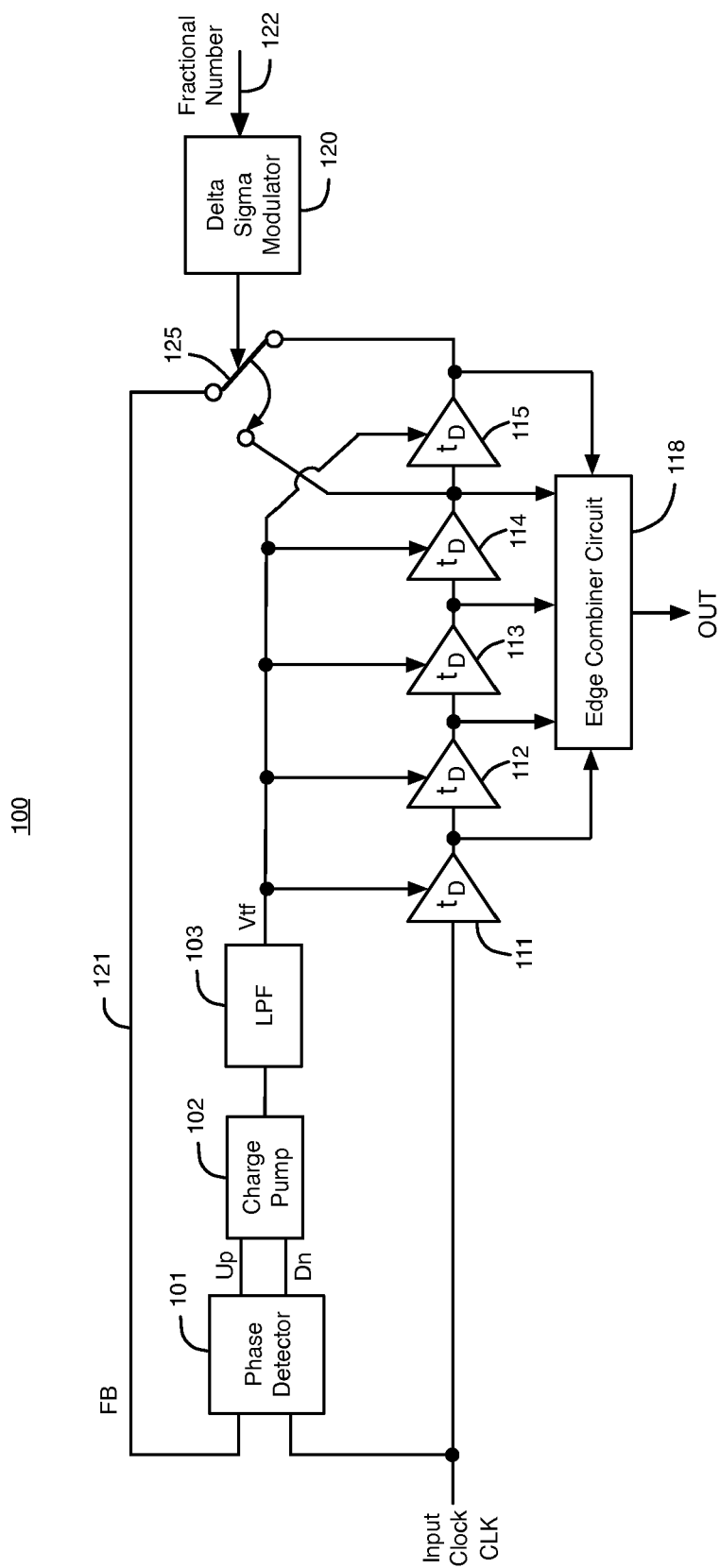
FIG. 1 illustrates a delay-locked loop (DLL), according to an embodiment of the present invention.

FIG. 1 illustrates a delay-locked loop (DLL) 100, according to a first embodiment of the present invention. DLL 100 includes phase detector 101, charge pump 102, low pass filter 103, five voltage controlled delay circuits 111-115, edge combiner circuit 118, delta sigma modulator 120, feedback line 121, and selector circuit 125. Although DLL 100 has five delay circuits 111-115, DLLs of the present invention can have any suitable number of delay circuits.

Phase detector 101 receives a reference periodic (clock) input signal CLK and a feedback signal FB on feedback line 121. Phase detector 101, charge pump 102, and low pass filter 103 generate a control voltage Vtf. The delay $t_D$ that each of the delay circuits 111-115 provides to its input signal is adjustable. Control signal Vtf controls the adjustable delay $t_D$ of delay circuits 111-115.

Vtf determines how long it takes for a signal to pass through the delay circuits. As Vtf varies, the delay $t_D$ of each of delay circuits 111-115 also varies. At any point in time, each of the delay circuits 111-115 has the same delay $t_D$. Vtf varies the delay of the delay circuits 111-115 by the same amount. Delay circuits 111-115 can each be implemented, for example, as two inverters coupled in series, where each inverter receives voltage Vtf as a power supply voltage at the source of the p-channel transistor.

Selector circuit 125 alternately couples the outputs of delay circuits 114 and 115 to feedback line 121. Selector circuit 125 can be, for example, a multiplexer. Delta sigma modulator 120 selects a duty cycle for selector circuit 125. Delta sigma modulator 120 controls the duty cycle of selector circuit 125 based on the fractional number at input 122. Delta sigma modulator 120 can have a single serial input or multiple parallel inputs and a single serial output or multiple parallel outputs.

Phase detector 101 aligns the phase of input clock signal CLK to $(N \times t_D + \{\text{fractional number} <0,1>\} t_D)$, where N is the number of delay circuits (five in DLL 100). The fractional number is given by the average number of 1s in the binary input of delta sigma modulator 120. As a result, the delay ($t_D$) of each of delay circuits 111-115 is inversely proportional to the number of delay circuits (N) plus the fractional number (FN), as shown by equation (1).

$$t_D = \frac{T_{REF}}{N+FN} \qquad (1)$$

Thus, the period $T_{REF}$ of the input clock signal CLK divided by the delay $t_D$ of one of the delay circuits equals a non-integer rational number (N+FN), even when the period, the phase, and the frequency of the periodic input signal are constant and not changing.

Edge combiner circuit 118 combines the edges of the 5 output signals of delay circuits 111-115 into an output signal OUT. Edge combiner 118 is a frequency multiplier. Edge combiner 118 can be implemented, for example, using XOR logic gates.

By combining the output signals of delay circuits 111-115 using combiner circuit 118, a waveform OUT is generated that has N equally spaced rising edges, except that last two rising edges are spaced at a distance of the fractional number times the delay of the delay circuits $t_D$, even when the frequency of the input clock signal CLK is not changing. Output signal OUT can have an average frequency that is the product of the frequency of the input clock signal CLK and a fractional non-integer rational number that is determined by the fractional number at input 122. Although the fundamental frequency of output signal OUT is the desired fractional number, a heavy spurious frequency (1/Tref) content may be observed in the output signal.

Figure 2:
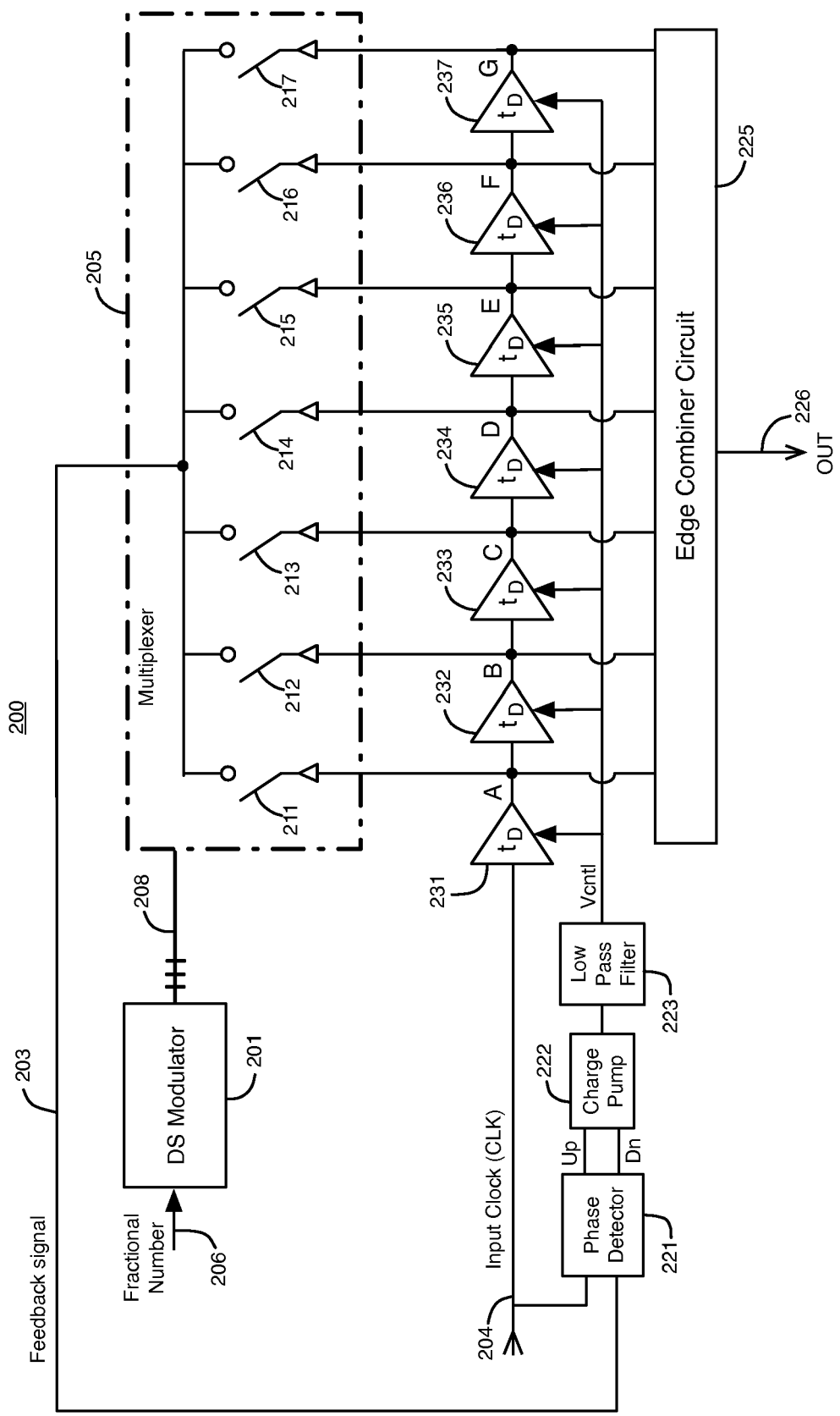
FIG. 2 illustrates another delay-locked loop (DLL), according to an embodiment of the present invention.

FIG. 2 illustrates a delay-locked loop (DLL) 200, according to a second embodiment of the present invention. DLL 200 includes a delta sigma (DS) modulator 201, a multiplexer 205, an edge combiner circuit 225, seven voltage controlled delay circuits 231-237, and phase detection circuitry. The phase detection circuitry includes phase detector 221, a charge pump 222, a low pass filter 223. Although DLL 200 has seven delay circuits 231-237, DLLs of the present invention can have any suitable number of delay circuits.

A first input of the phase detector 221 is coupled to receive a clock signal CLK at input terminal 204. A second input of the phase detector 221 is coupled to receive a feedback signal on feedback line 203 from an output of multiplexer 205. Phase detector 221 generates Up and Down (Dn) output signals that indicate the difference in phase between the clock signal CLK and the feedback signal.

The output signals of phase detector 221 are provided to an input of charge pump 222. Charge pump 222 is a DC/DC voltage converter circuit that converts the output signals of phase detector 221 into an output DC voltage. Low pass filter 223 filters the output voltage of charge pump 222. Low pass filter 223 reduces the voltage ripple in the output of charge pump 222 to generate a control voltage signal Vcntl. The control voltage Vcntl is provided to power supply inputs of voltage controlled delay circuits 231-237, as shown in FIG. 2.

The first delay circuit 231 receives the input clock signal CLK at its delay input. The delay circuits 231-237 are coupled together in series to form a delay chain. In the delay chain, the output of each delay circuit 231-236 is coupled to the delay input of a subsequent delay circuit 232-237, respectively, as shown in FIG. 2.

The signals pass through the seven delay circuits 231-237 from left to right in FIG. 2. Each of the delay circuits 231-237 generates an output signal that is a delayed version of its input signal. The delayed output signals of delay circuits 231-237 are labeled A-G, respectively in FIG. 2.

The delay $t_D$ that each of the delay circuits 231-237 provides to its input signal is adjustable. Control signal Vcntl controls the adjustable delay $t_D$ of delay circuits 231-237. As Vcntl varies, the delay $t_D$ of each of delay circuits 231-237 also varies. At any point in time, each of the delay circuits 231-237 has the same delay $t_D$.

Each of the delay circuits 231-237 can, for example, include two inverters coupled in series to provide a non-inverting delay circuit. Vcntl is coupled to power supply inputs of each delay circuit. As Vcntl varies, the current through the inverters also varies, effecting the time it takes for signals to pass through the delay circuit. Delay circuits 231-237 can also be implemented using many other well-known circuit designs. Delay circuits 231-327 are single ended. However, DLLs of the present invention can also have a delay chain with differential delay circuits.

The output of each delay circuit 231-237 is also coupled to an input of multiplexer 205. Multiplexer 205 selectively couples the output signal of one of the delay circuits 231-237 to feedback line 203 during one or more periods of the clock signal.

Multiplexer 205 is represented in FIG. 2 as 7 parallel switches 211-217. However, multiplexer 205 can be designed in any suitable manner. Multiplexer 205 controls the opening and closing of switches 211-217. Only one of the switches 211-217 is closed (i.e., conducting current) in any given period of the clock signal. When one of the switches 211-217 is closed, all of the other switches are open (i.e., not conducting current).

When multiplexer 205 closes one of the switches 211-217, that switch couples the output of one of the delay circuits to feedback line 203. The output signal of the delay circuit that is coupled to feedback line 203 is transmitted to the second input of phase detector 221. Multiplexer 205 controls the states of switches 211-217 to feed back the output signal a delay circuit to the second input of phase detector 221.

Phase detector 221 varies control signal Vcntl in an attempt to line up the phases of clock signal CLK and the feedback signal on feedback line 203. For example, phase detector 221 can vary Vcntl to cause the rising edges of the feedback signal on feedback line 203 to line up with the rising edges of clock signal CLK.

When the phases of the clock signal CLK and the feedback signal move out of alignment, phase detector 221 varies control signal Vcntl. As the voltage of control signal Vcntl changes, the delays of delay circuits 231-237 increase or decrease until the phases of the feedback signal and the clock signal CLK at input 204 are aligned.

DLL 200 is typically designed so that phase detector 221 compares the current period of clock signal CLK with the previous period of CLK on feedback line 203. According to an alternative embodiment, DLL 200 can be designed so that phase detector 221 compares the current period of clock signal CLK with the period of CLK that was received at input terminal 204 two periods ago (or three periods ago, four periods ago, etc.), according to a sub-harmonic operation of DLL 200.

Multiplexer 205 is an example of a selector circuit. Multiplexer 205 is controlled by a multi-bit delta sigma (DS) modulator 201. DS modulator 201 receives an analog input signal at input 206 that is indicative of a fractional number. DS modulator 201 performs an analog-to-digital conversion on the analog input signal. DS modulator 201 converts the analog signal into a digital output bitstream 208 at an oversampling rate that causes the average value of the bitstream 208 to equal the fractional number at input 206. For example, the oversampling rate of DS modulator 201 can be 10:200.

The bitstream 208 is provided to select inputs of multiplexer 205 in parallel or in series. Multiplexer 205 selectively couples the outputs of delay circuits 231-237 to feedback line 203 in response to the digital signals in bitstream 208.

Multiplexer 205 alternately couples two or more of delay circuits 231-237 to feedback line 203 at different times. For example, multiplexer 205 can couple delay circuit 236 and delay circuit 237 to feedback line 203 during alternating periods of the clock signal. As another example, multiplexer 205 can couple three, four, five, six or seven of delay circuits 231-237 to feedback line 203 in response to bitstream 208 during different periods of clock signal CLK.

When multiplexer 205 couples one of delay circuits 231-237 to feedback line 203, phase detector 221 and charge pump 222 adjust the delay of delay circuits 231-237 in an attempt to line up the phases of the signals at inputs 203 and 204. When multiplexer 205 opens one of the switches 211-217 and closes another switch, the phases of the clock and feedback signals are no longer aligned. DLL 200 then attempts to realign the phases of the input and feedback signals. Multiplexer 205 can open and close switches 211-217 faster than the phase detector and delay circuits 231-237 can re-align the phases of the feedback and clock signals.

As mentioned above, multiplexer 205 only couples the output of one of delay circuits 231-237 to feedback line 203 at any time. The relative period of time that multiplexer 205 couples the output of each delay circuit to feedback line 203 (also referred to as the duty cycle) determines the average frequency Ffb of the feedback signal.

Multiplexer 205 selects the duty cycles of the switches 211-217 based on the fractional number input to delta sigma modulator 201 at input 206. For example, multiplexer 205 can couple the output of delay circuit 236 to feedback line 203 during every even period of the clock signal CLK, and multiplexer 205 can couple the output of delay circuit 237 to feedback line 203 during every odd period of the clock signal. Thus, the outputs of delay circuits 236 and 237 are alternately coupled to feedback line 203 during every other period of the clock signal.

As another example, multiplexer 205 couples the output of delay circuit 236 to feedback line 203 during every fourth period of the clock signal, and multiplexer 205 couples the output of delay circuit 237 to feedback line 203 during the remaining three out of every four periods of the clock signal. As yet another example, multiplexer 205 couples the output of delay circuit 233 to feedback line 203 during only one in every four periods of the clock signal, and multiplexer 205 couples the output of delay circuit 237 to feedback line 203 during the remaining three out of every four periods of the clock signal.

Edge combiner circuit 225 is a frequency multiplier that is coupled to the output terminals of each of the delay circuits 231-237. Edge combiner circuit 225 combines the rising edges (or alternatively the falling edges) of the output signals A-G of delay circuits 231-237 to generate an output signal OUT. Output signal OUT can have an average frequency that is the product of the frequency of the input clock signal CLK and a fractional non-integer rational number that is determined by the fractional number at input 206.

According to various embodiments of FIG. 2, edge combiner circuit 225 can be an analog adder circuit or a digital adder circuit that adds the output signals of delay circuits 231-237. Edge combiner circuit 225 can include a high pass filter with a capacitor that combines the output signals of delay circuits 231-237 into one output signal at output 226. A digital adder circuit can be used at low frequencies. The digital adder circuit combines digital pulses at the output terminals of each of delay circuits 231-237 into one signal at output 226.

Edge combiner circuit 225 provides a frequency multiplication function. For example, to provide a ×7 frequency multiplication function, edge combiner circuit 225 combines the output signals of delay circuits 231-237 to obtain a signal having seven pulses in each period of the clock signal CLK.

According to additional embodiments, the output signals of any number N of delay circuits in a DLL of the present invention can be combined to provide a frequency multiplication of ×N. A DLL of the present invention, such as DLL 200, can be used as a frequency multiplier in a frequency synthesizer.

Figure 3:
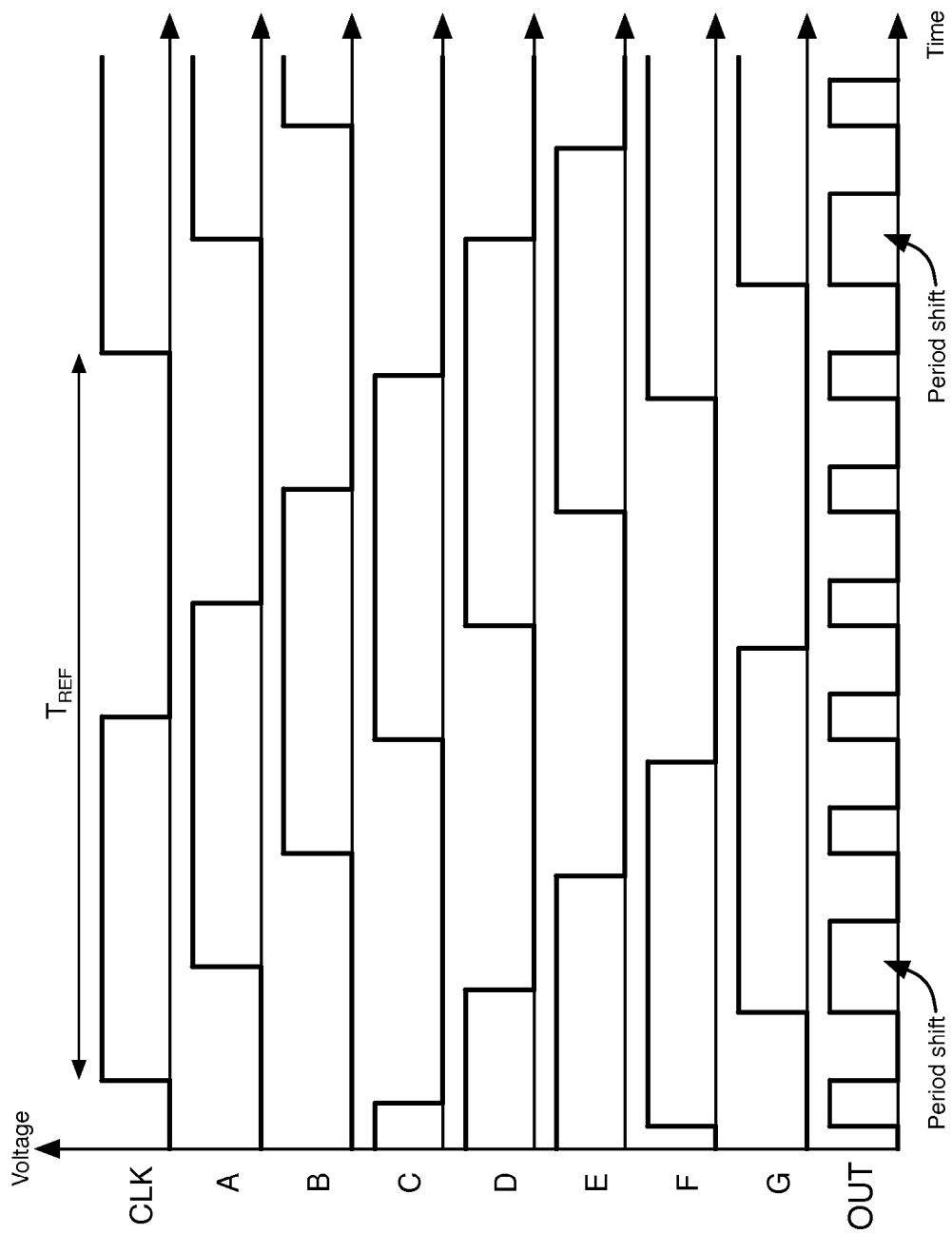
FIG. 3 is a graph that illustrates examples of the output signals of the delay circuits shown in FIG. 2, according to an embodiment of the present invention.

FIG. 3 is a diagram that illustrates examples of the output signals A-G of delay circuits 231-237, respectively, according to a particular implementation of FIG. 2. Each of the waveforms A-G is a delayed version of clock signal CLK. The output signal OUT is generated by combining waveforms A-G using edge combiner circuit 225. In the example shown in FIG. 3, the average frequency of output signal OUT is the product of the frequency Fref of the clock signal CLK times a fractional number.

As shown in FIG. 3, a discrete shift occurs in the period of the output signal OUT at every rising edge of the delay signal A from delay circuit 231. The periodic shift in the phase of OUT causes OUT to have a varying frequency.

The shift in the phase and period of OUT can cause timing errors in the output signal OUT. The output signal OUT of edge combiner circuit 118 in DLL 100 also may also contain phase and period shifts. The embodiment of FIG. 4 addresses this issue by providing a delay-locked loop circuit that compensates for timing errors generated by the phase shift in the output signals of DLLs 100 and 200.

Figure 4:
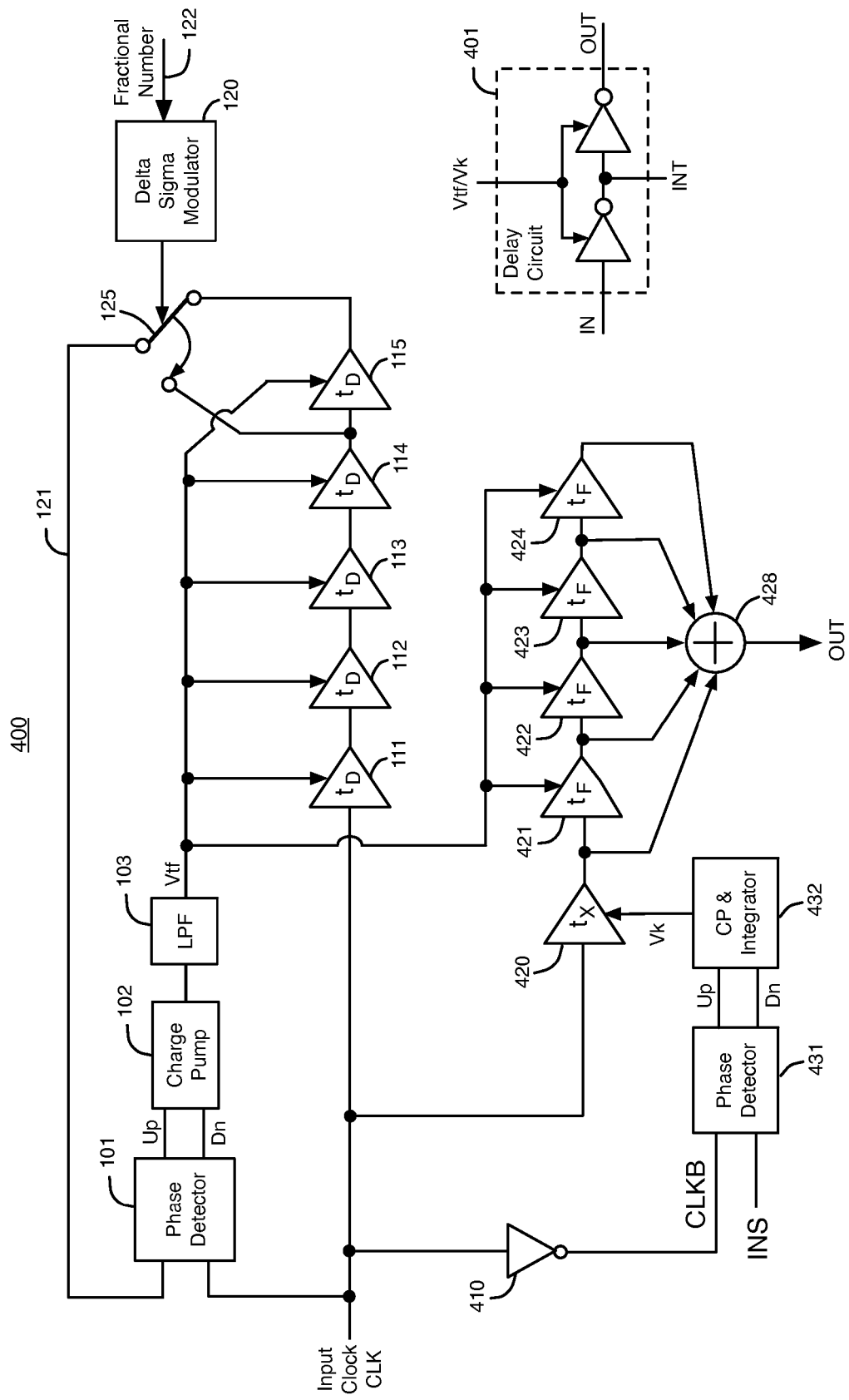
FIG. 4 illustrates another delay-locked loop (DLL), according to an embodiment of the present invention.

FIG. 4 illustrates another delay-locked loop (DLL) 400, according to an embodiment of the present invention. DLL 400 includes phase detectors 101 and 431, charge pump 102, low pass filter 103, voltage controlled delay circuits 111-115 and 420-424, delta sigma modulator 120, selector circuit/multiplexer 125, feedback line 121, inverter 410, edge combiner circuit 428, and charge pump and integrator 432.

Circuitry 101-103, 111-115, 120, and 125 function as described above with respect to FIG. 1. Delay circuits 420-424 are coupled together in series to form a delay chain as shown in FIG. 4. The delay input of delay circuit 420 is coupled to receive input clock signal CLK. The output of delay circuit 420 is coupled to the delay input of delay circuit 421. The delay inputs of delay circuits 422-424 are coupled to the outputs of delay circuits 421-423, respectively.

The power supply input terminals of delay circuits 421, 422, 423, and 424 are coupled to receive control voltage Vtf from low pass filter 103. Thus, voltage Vtf controls the delay $t_F$ of delay circuits 421-424. If delay circuits 211-215 and 421-424 have identical circuit architectures, the delay $t_F$ of delay circuits 421-424 equals the delay $t_D$ of delay circuits 111-115.

Delay circuit 401 shown in FIG. 4 is an example of the architecture of each of delay circuits 111-115 and 420-424. Delay circuit 401 includes two CMOS inverters coupled together in series between a delay input terminal IN and an output terminal OUT. The two inverters receive a power supply voltage from control voltage Vft (or from voltage Vk for inverter 420). An intermediate node INT can be accessed between the two inverters.

The output signals of delay circuits 420-424 are combined by a phase combiner or edge combiner circuit 428 to generate a periodic output signal OUT. DLL 400 is able to generate a waveform for output signal OUT that has equally spaced pulses (i.e., equal periods) by varying the delay of delay circuit 420 using a separate feedback path. The separate feedback path includes phase detector 431 and charge pump and integrator circuitry 432. Further details of delay circuit 420 are now described with respect to FIG. 5.

Figure 5:
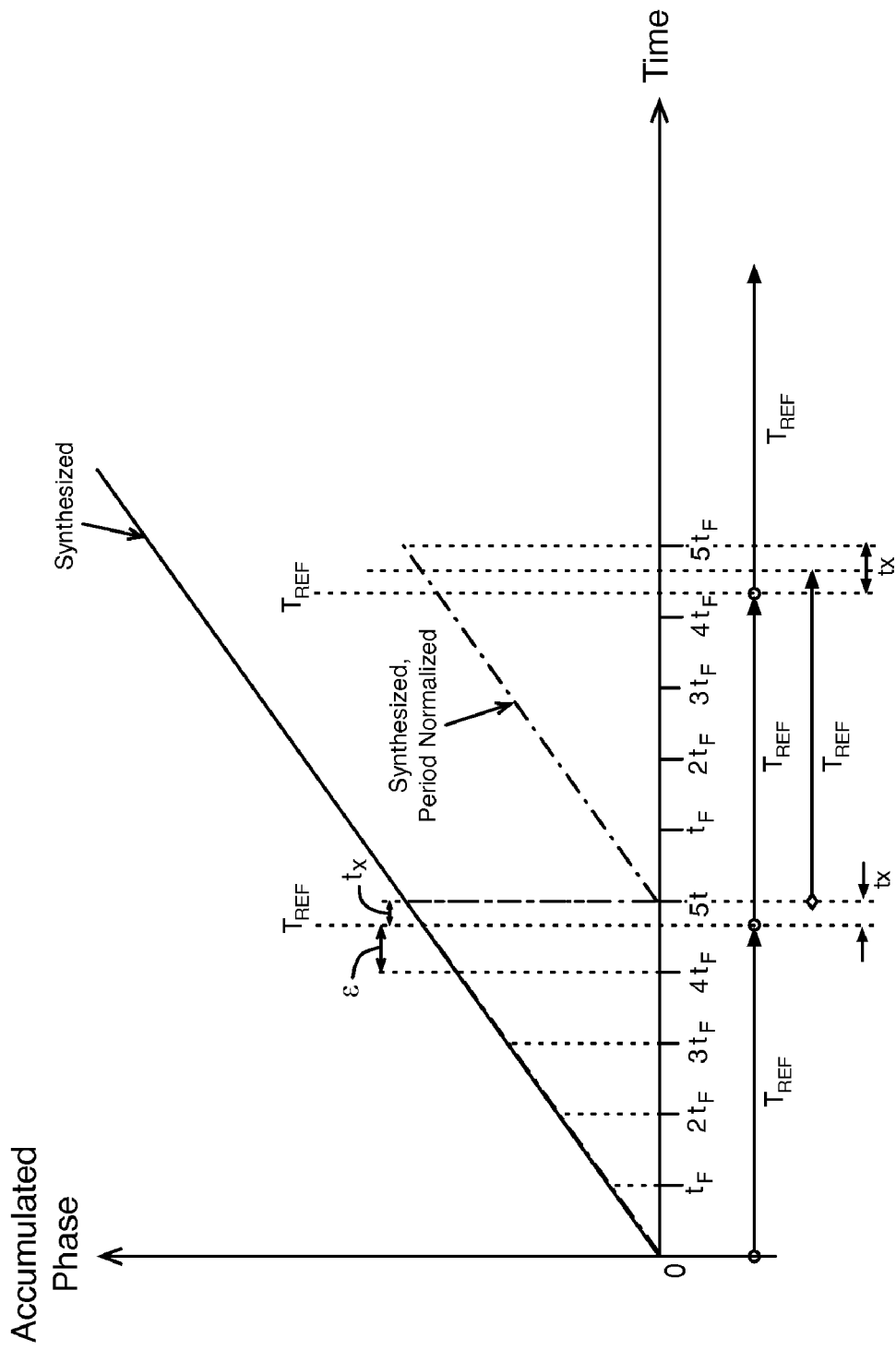
FIG. 5 is a graph that illustrates the operation of the DLL of FIG. 4.

FIG. 5 is a graph that illustrates the operation of DLL 400. The intervals $t_F$, $2t_F$, $3t_F$, $4t_F$, and $5t_F$ on the time axis of the graph represent rising edges in the output signal OUT of combiner 428. The rising edges at $t_F$, $2t_F$, $3t_F$, and $4t_F$ are generated by rising edges in the output signals of delay circuits 421-424, respectively. The rising edges at $5t_F$ are generated by rising edges in the output signal of delay circuit 420. The rising edges of CLK are marked as $T_{REF}$ in FIG. 5, where $T_{REF}$ is the period of input clock signal CLK.

As shown in FIG. 5, a rising edge in the output signal of delay circuit 424 ($4t_F$) is spaced at a unit of time of $\epsilon$ from the next rising edge in CLK. The rising edges of CLK represents an equally spaced time instant $T_{REF}$. The next pulse $5t_F$ in the output signal OUT is spaced a unit of time of $t_X$ from the equally spaced time instant at $T_{REF}$.

The delay $t_X$ of delay circuit 420 is inserted into the delay chain between input clock signal CLK and delay circuit 421. The delay of delay circuit 420 is controlled by phase detector 431 that detects an error value and generates Up and Dn output signals. The Up and Dn output signals are used by circuitry 432 to adjust the delay of the delay circuit 420, forcing delay circuit 420 to have a delay of $t_X$.

To provide the most accurate output signal, the error values are detected and compensated for prior to the next period $T_{REF}$ of CLK. However, a latency of one clock cycle is typically present in a DLL feedback loop. This latency would be acceptable if the period-to-period delay adjustments are very small.

DLL 400 is designed to correct the error value during the current period of CLK to achieve a more accurate output signal when the delay adjustments are larger. In DLL 400, the delay value $t_X$ is calculated in the current period $T_{REF}$ of CLK.

The delay $t_X$ of delay circuit 420 is controlled by phase detector 431 and charge pump and integrator circuit 432. Phase detector 431 compares the phase of an inverted reference clock signal CLKB and the phase of an intermediate signal INS from delay circuit 423 to generate an error signal that controls the delay of circuit 420.

An example is now provided to further illustrate the operation of DLL 400. Inverter 410 converts the falling edges of CLK into rising edges and the rising edges of CLK into falling edges to generate an inverted clock signal CLKB. If phase detector 101 attempts to line up the rising edges of clock signal CLK with edges of the feedback signal on line 121, then phase detector 431 compares the rising edges of CLKB to the rising edges of intermediate signal INS. If clock signal CLK has a 50% duty cycle, then the rising edges of CLKB occur half way through each of period of CLK at ½ $T_{REF}$, and intermediate signal INS is selected to have a delay equal to $2.5 \times t_F$. DLL 400 adjusts the rising edges of INS until they occur at the same time as the rising edges of CLKB at ½ $T_{REF}$ to achieve equal periods in output signal OUT.

DLL 400 can calculate the adjustment value $t_X$ at ½ $T_{REF}$ by comparing the rising edges of the inverted clock signal CLKB with signal INS that is selected to equal $2½ t_F$. Equation (2) shown below can be derived by observing the relationships in FIG. 5.

$$t_X = 5t_F - T_{REF} \qquad (2)$$

By dividing both sides of equation (2) by 2, equation (3) can be obtained.

$$\frac{1}{2}t_X = 2\frac{1}{2}t_F - \frac{1}{2}T_{REF} \qquad (3)$$

A signal having a delay of $2½ t_F$ can be taken from the midpoint of delay circuit 423. Using the example of delay circuit 401, the intermediate signal $2½ t_F$ can be taken from the INT node of delay circuit 423 and compared to the rising edges of CLKB by phase detector 431 to generate the delay $t_X$ of delay circuit 420. The error signals Up and Dn generated by phase detector 431 are based on equation (3).

Charge pump and integrator circuitry 432 generate a control voltage Vk in response to the Up and Dn output signals of phase detector 431. Control voltage Vk sets the variable delay of delay circuit 420 to $t_X$. Charge pump and integrator circuitry 432 doubles the delay value ½ $t_X$ generated from phase detector 431 to obtain a compensating delay $t_X$ for delay circuit 420.

By adding a delay of $t_X$ to the output signal of delay circuit 420, the rising edge at the output of delay circuit 420 occurs at $5t_F$. Subsequent rising edges at the outputs of delay circuits 421-424 also occur at equally spaced intervals $t_F$, $2t_F$, $3t_F$, and $4t_F$. As a result, combiner 428 generates an output signal OUT that has equally spaced pulses and equal length periods, as long as the phase and the frequency of the input clock signal CLK remain constant. Thus, the period shifts shown in FIG. 3 do not occur.

Circuit elements 431-432 may have to adjust subsequent values for delay $t_X$ in each period $T_{REF}$ to maintain equally spaced pulses in OUT. As shown in the example of FIG. 5, the second value for $t_X$ is greater than the first value for $t_X$. Output signal OUT can have a frequency that is the product of the frequency of input clock signal CLK and a fractional non-integer rational number, by setting an appropriate value for the fractional number at input 222, as described above.

Figure 6A:
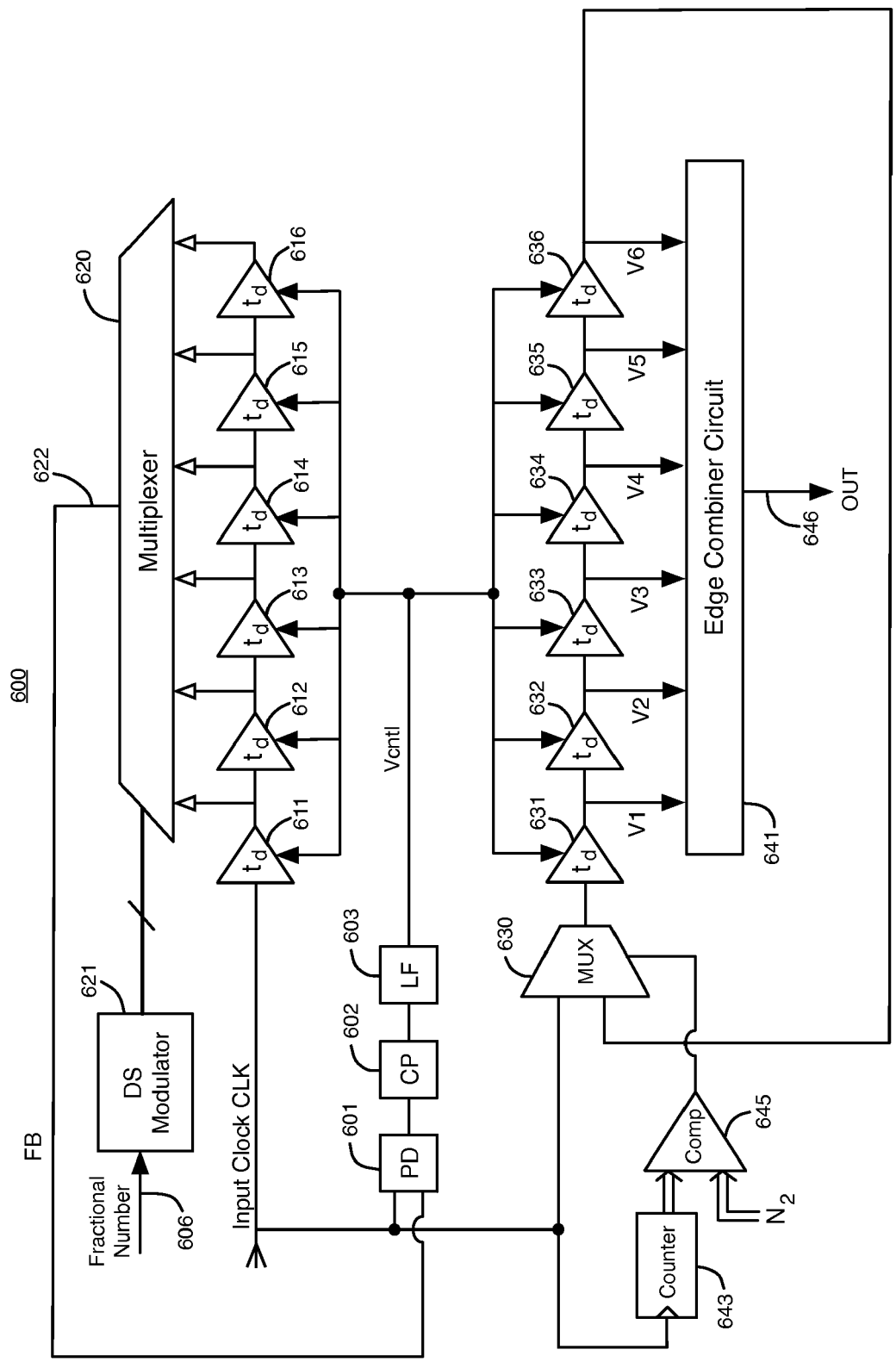
FIG. 6A illustrates a fractional N-synthesizer delay-locked loop (DLL) with a phase error reset feature, according to another embodiment of the present invention.

FIG. 6A illustrates a fractional N-synthesizer delay-locked loop (DLL) 600 with a phase error reset feature, according to another embodiment of the present invention. DLL 600 can function as a frequency multiplier for a frequency synthesizer. DLL 600 includes a delta sigma (DS) modulator 621, edge combiner circuit 641, multiplexers 620 and 630, two delay chains, phase detection circuitry, counter 643, and comparator 645. The first phase detection circuitry includes a phase detector circuit 601, a charge pump circuit 602, and a low pass filter 603. The first delay chain includes delay circuits 611-616, and the second delay chain includes delay circuits 631-636.

Phase detector circuit 601 receives a periodic reference clock signal CLK at a first input and a feedback signal FB at a second input. The output signal(s) of phase detector 601 vary based on the phase difference between signals CLK and FB. Charge pump circuit 602 generates a DC voltage output in response to the output signal(s) of phase detector 601. Low pass filter 603 filters the DC output voltage of charge pump 602 to generate a voltage control signal Vcntl.

The voltage control signal Vcntl is provided to control inputs of delay circuits 611-616 and 631-636. At any given point in time, each of the delay circuits 611-616 and 631-636 provides the same amount of delay to the signals at their delay inputs. The delay provided by each of delay circuits 611-616 and 631-636 varies in response to changes in the voltage of control signal Vcntl.

DLL 600 includes a master loop and a slave loop. The master loop includes phase detector 601, charge pump 602, low pass filter 603, delay circuits 611-616, multiplexer 620, and DS modulator 621. Multiplexer 620 alternately couples the outputs of two or more of delay circuits 611-616 to feedback line 622 during different periods of CLK, as described above with respect to multiplexer 205 of FIG. 2. Multiplexer 620 is controlled by DS modulator 621, as described above with respect to delta sigma modulator 201.

Delta sigma modulator 621 receives signals representing a fractional number at input 606. The fractional number can be any rational number. The output signal OUT of edge combiner 641 can have an average frequency that is the product of the frequency of the input clock signal CLK and a fractional non-integer rational number that is determined by the fractional number at input 606.

The slave loop includes multiplexer 630, delay circuits 631-636, edge combiner circuit 641, counter circuit 643, and comparator 645. Edge combiner circuit 641 converts each rising edge (or each falling edge) in output signals V1-V6 of delay circuits 631-636 into a pulse at output 646. As a result, edge combiner circuit 641 generates a series of pulses at output 646.

Reference clock signal CLK is transmitted to a clock input of counter circuit 643. Counter circuit 643 generates a set of parallel digital count signals at first inputs of comparator 645. Counter 643 increases the binary value of the count signals in response to clock signal CLK. A second set of parallel signals having a binary value equal to $N_2$ is transmitted to second inputs of comparator 645. Comparator 645 can include multiple comparator circuits. When the binary value of the count signals equals $N_2$, comparator 645 causes its output signal to transition from low to high.

The reference clock signal CLK is transmitted to a first input of multiplexer 630. The output signal of delay circuit 636 is transmitted to the second input of multiplexer 630. When the output signal of comparator 645 is low, multiplexer 630 couples the output of delay circuit 636 to the delay input of delay circuit 631 to form a ring oscillator. When the output signal of comparator 645 is high, multiplexer 630 couples reference clock signal CLK to the delay input of delay circuit 631.

As mentioned above, the signals received by delta sigma modulator 621 at input 606 represent a fractional number. The fractional number represented by the signals at input 606 can be expressed as the quotient of two integers, $N_1$ and $N_2$, where the signals at the second inputs of comparator 645 represent $N_2$. In a high resolution frequency synthesizer, $N_1$ and $N_2$ can be extremely large numbers. If $N_1$ and $N_2$ are extremely large numbers, DLL 600 may require complex circuitry.

To reduce the complexity of DLL 600, an error β is defined such that two smaller integer numbers for $N_1$ and $N_2$ can be used to approximate the fractional number at input 606 within an allowed error β. The error β is calculated without taking into account signal noise. When the rising edges (or the falling edges) of signal CLK are within an error β of the rising edges (or the falling edges) of output signal OUT, comparator 645 causes multiplexer 630 to couple clock signal CLK to delay circuit 631 to align the edges of CLK and OUT and to reset the accumulated phase error. The error β can be, for example, 0.1% of the period $T_{REF}$ of CLK.

The period $T_{OUT}$ of the output signal OUT at output 646 is expressed by equation (4).

$$T_{OUT} = \frac{T_{REF}}{M(1+A)} \qquad (4)$$

Figure 6B:
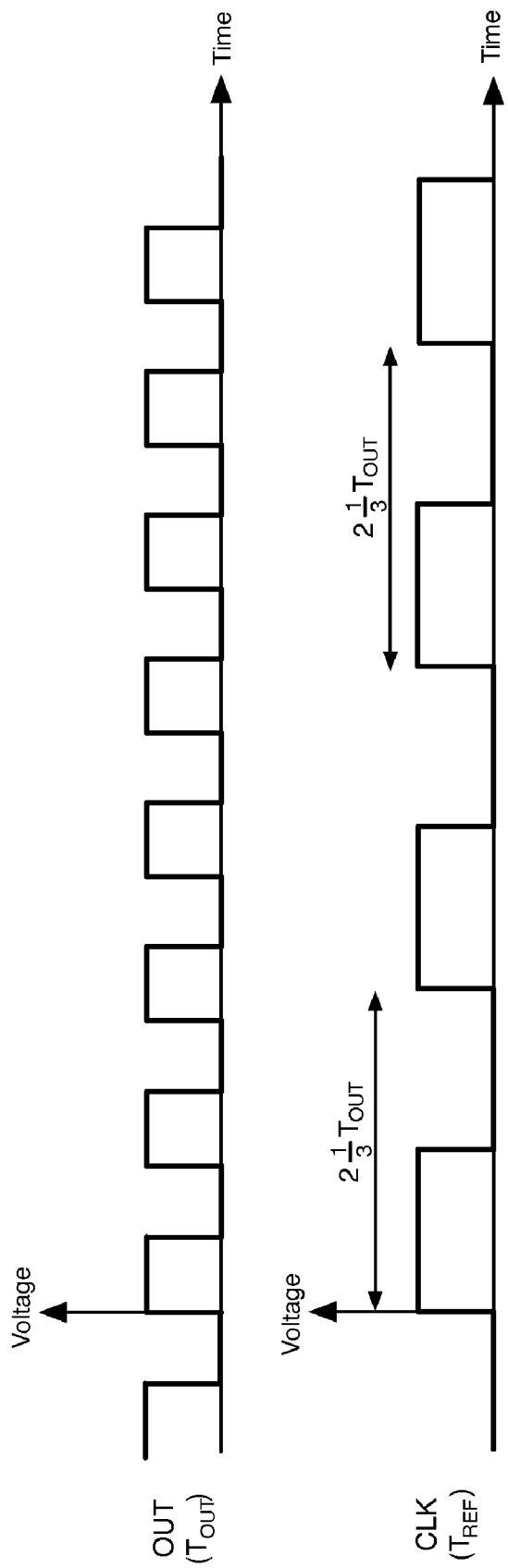
FIG. 6B is a graph that illustrates examples of the input and output signals of the DLL of FIG. 6A, according to an embodiment of the present invention.

In equation (4), M in an integer, A is a fractional number in a range from 0 to 1, and $T_{REF}$ is the period of the reference clock signal CLK. Within the predefined phase error β, the rising edges (or the falling edges) of the time domain waveforms for $T_{OUT}$ and $T_{REF}$ are aligned. FIG. 6B illustrates an example of the waveforms for $T_{OUT}$ and $T_{REF}$ with M=2, A=⅓, and 7×$T_{OUT}$=3×$T_{REF}$.

In general, A can be a real number (0, 1) for which the two rising edges of $T_{OUT}$ and $T_{REF}$ do not align, unless a threshold (error β) is defined. Assuming that A is a fractional number, A=K/L, ideal alignment between $T_{OUT}$ and $T_{REF}$ occurs when equation (5) is satisfied.

$$T_{OUT} = \frac{T_{REF}}{M\left(1+\frac{K}{L}\right)} = \frac{T_{REF} \times L}{M(L+K)} \qquad (5)$$

M(L+K) cycles of the output signal OUT at output 646 coincide with L cycles of reference clock signal CLK. M(L+K) is integer $N_1$, and L is integer $N_2$. In a practical circuit, integer coefficients $N_1$ and $N_2$ can be selected for signals OUT and CLK such that equation (6) is satisfied within a predefined error β.

$$N_1 \times T_{OUT} = N_2 \times T_{REF} \qquad (6)$$

A technique of making integer multiples of two numbers equal as shown in equation (6) is called a Vernier technique. Multiplexer 630 connects clock signal CLK to delay circuit 631 only when equation (6) is satisfied within the predefined error β. Thus, every $N_2$ periods of CLK, the accumulated ring oscillator jitter is reset and forced to go to a phase value within error β. This technique cancels the lower frequency noise of the ring oscillator. Noise at frequencies greater than $$\frac{1}{N_2 \times T_{REF}}$$

remain unchanged.

Figure 7:
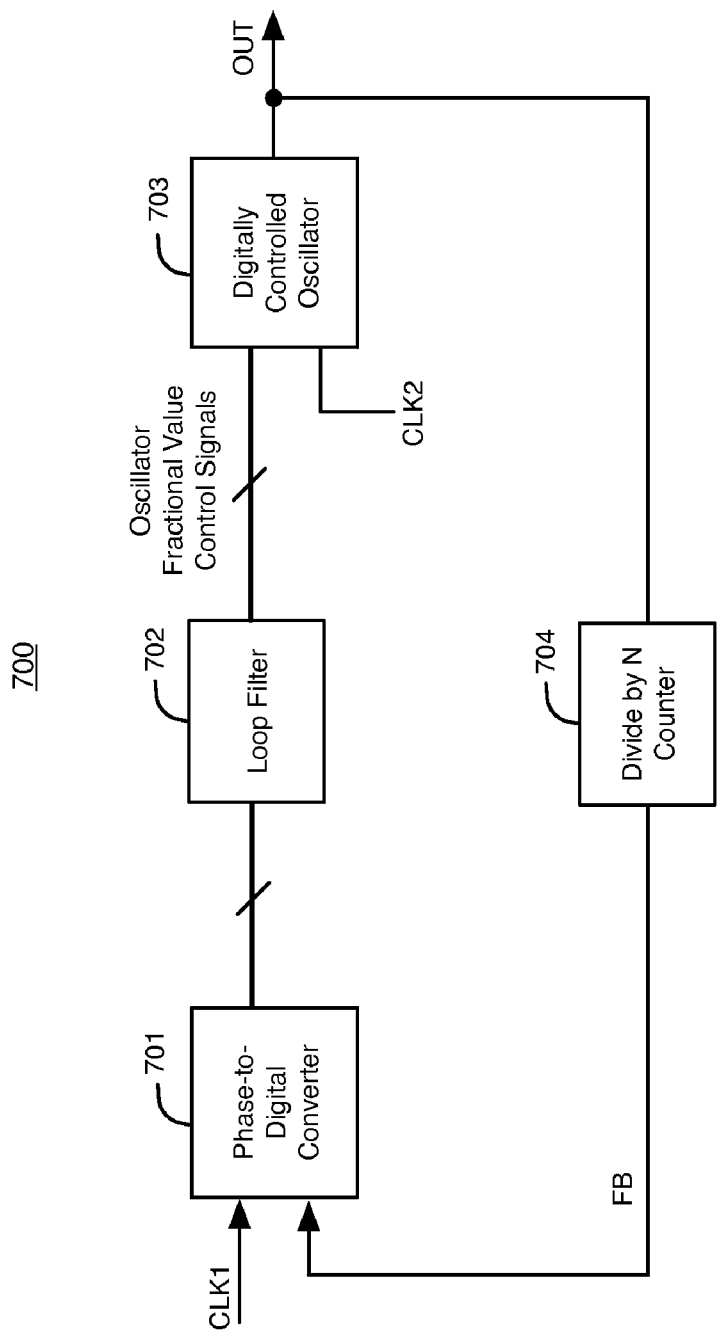
FIG. 7 illustrates a phase-locked loop (PLL), according to another embodiment of the present invention.

FIG. 7 illustrates a phase-locked loop (PLL) 700, according to another embodiment of the present invention. PLL 700 includes phase-to-digital converter circuit 701, loop filter 702, digitally controlled oscillator (DCO) 703, and divide-by-N counter 704.

Phase-to-digital converter 701 compares the phases of a first input clock signal CLK1 and a feedback signal FB from divide-by-N circuit 704. Divide-by-N circuit 704 is a counter circuit that divides the frequency of output signal OUT from DCO 703 to generate the feedback signal FB. Phase-to-digital converter 701 generates a set of parallel digital output signal that vary in response to the phase difference between CLK1 and FB. Loop filter 702 filters the parallel digital signals to generate oscillator fractional value control signals that are transmitted to inputs of digitally controlled oscillator (DCO) 703.

DLL 400 shown in FIG. 4 is an example of DCO 703. According to this implementation of DCO 703, the oscillator fractional value control signals are provided to inputs of delta sigma modulator 120 to control the duty cycle of multiplexer 125. The fractional value control signals determine the frequency of output signal OUT from DCO 703. Output signal OUT from DCO 703 corresponds to output signal OUT from combiner 428.

DCO 703 also receives a second input clock signal CLK2. Clock signal CLK2 is provided to the same input as signal CLK in FIG. 4. Signals CLK1 and CLK2 in FIG. 7 can be the same signal with the same frequency or two different signals having different frequencies.

Figure 8:
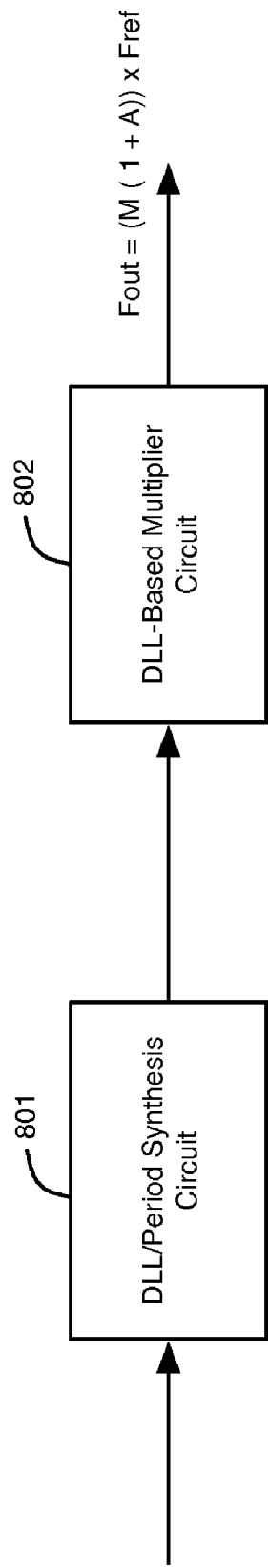
FIG. 8 illustrates a block diagram of a frequency synthesizer that can include one or more of the DLL embodiments of the present invention.

FIG. 8 illustrates a block diagram of a frequency synthesizer that can include one or more of the DLL embodiments of the present invention. DLL/period synthesis circuit 801 can include any of the DLL embodiments of the present invention, described herein. DLL-based multiplier circuit 802 generates an output signal OUT having a frequency of $F_{OUT}$ that is fractional value of the frequency Fref of a periodic input signal, even when the frequency and phase of Fref is constant, according to equation (7).

$$F_{OUT} = Fref(M(1+A)) \quad (7)$$

In equation (7), A is a fractional number that corresponds to the input of the delta sigma modulator, Fref is the frequency of the periodic input signal, and M is an integer that corresponds to the multiplying factor of circuit 802. In some embodiments of the present invention, multiplier 802 is an edge combiner circuit, such as edge combiners 118, 225, 428, and 641. If (M(1+A)) is greater than 1, output signal OUT has a frequency $F_{OUT}$ that is greater than the frequency Fref of the periodic input signal.

Figure 9:
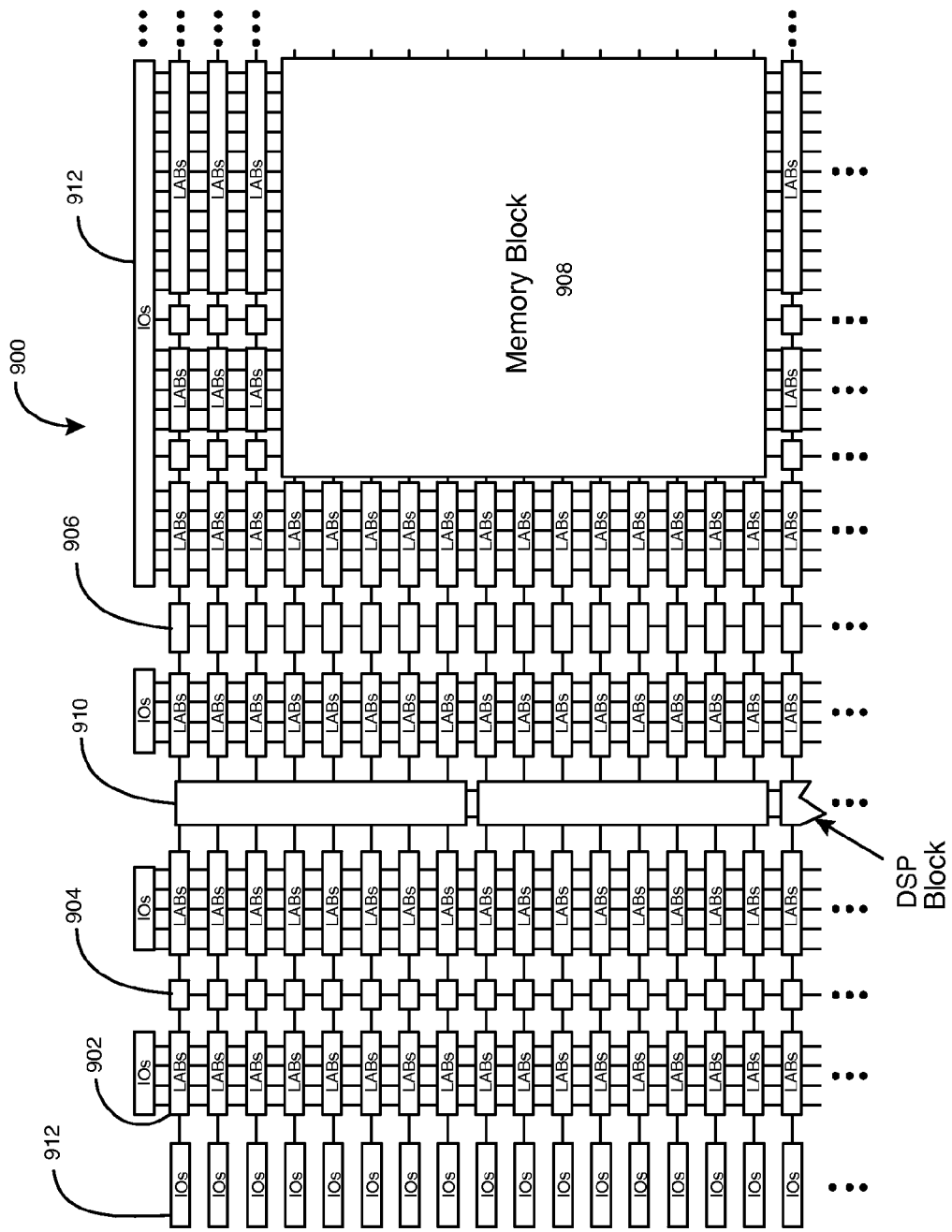
FIG. 9 is a simplified partial block diagram of an exemplary field programmable gate array (FPGA) that can include aspects of the present invention.

FIG. 9 is a simplified partial block diagram of a field programmable gate array (FPGA) 900 that can include aspects of the present invention. FPGA 900 is merely one example of an integrated circuit that can include features of the present invention. It should be understood that DLLs of the present invention can be applied to numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 900 includes a two-dimensional array of programmable logic array blocks (or LABs) 902 that are interconnected by a network of column and row interconnect conductors of varying length and speed. LABs 902 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 900 also includes a distributed memory structure including RAM blocks of varying sizes provided throughout the array. The RAM blocks include, for example, blocks 904, blocks 906, and block 908. These memory blocks can also include shift registers and FIFO buffers.

FPGA 900 further includes digital signal processing (DSP) blocks 910 that can implement, for example, multipliers with add or subtract features. IO blocks (IOs) 912 located, in this example, around the periphery of the chip support numerous single-ended and differential input/output standards. The IO blocks 912 contain IO buffers and are typically grouped into IO banks. It is to be understood that FPGA 900 is described herein for illustrative purposes only and that the present invention can be implemented in many different types of PLDs, FPGAs, and the like.

Figure 10:
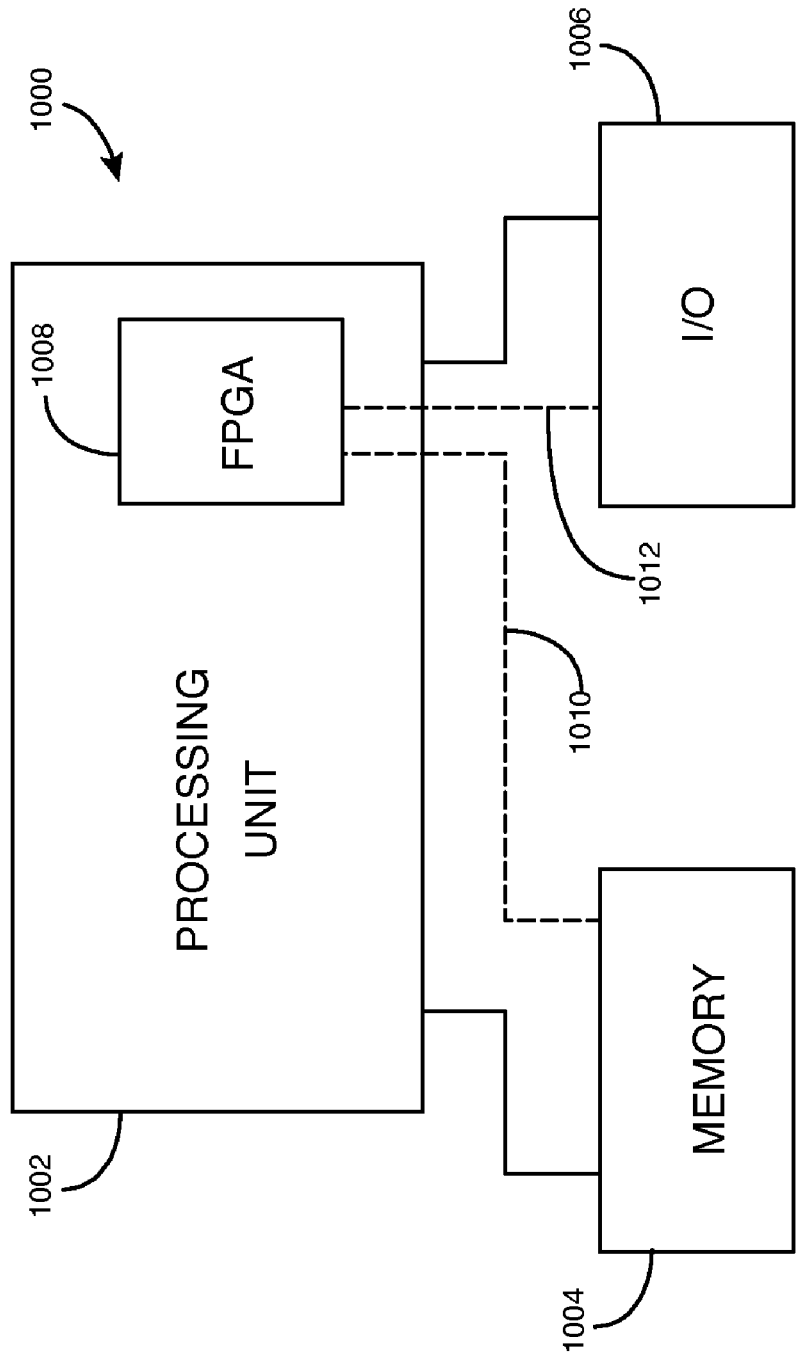
FIG. 10 shows a block diagram of an exemplary digital system that can embody techniques of the present invention.

The present invention can also be implemented in a system that has an FPGA as one of several components. FIG. 10 shows a block diagram of an exemplary digital system 1000 that can embody techniques of the present invention. System 1000 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 1000 can be provided on a single board, on multiple boards, or within multiple enclosures.

System 1000 includes a processing unit 1002, a memory unit 1004 and an I/O unit 1006 interconnected together by one or more buses. According to this exemplary embodiment, an FPGA 1008 is embedded in processing unit 1002. FPGA 1008 can serve many different purposes within the system in FIG. 10. FPGA 1008 can, for example, be a logical building block of processing unit 1002, supporting its internal and external operations. FPGA 1008 is programmed to implement the logical functions necessary to carry on its particular role in system operation. FPGA 1008 can be specially coupled to memory 1004 through connection 1010 and to I/O unit 1006 through connection 1012.

Processing unit 1002 can direct data to an appropriate system component for processing or storage, execute a program stored in memory 1004 or receive and transmit data via I/O unit 1006, or other similar function. Processing unit 1002 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 1008 can control the logical operations of the system. As another example, FPGA 1008 acts as a reconfigurable processor, which can be reprogrammed as needed to handle a particular computing task. Alternately, FPGA 1008 can itself include an embedded microprocessor. Memory unit 1004 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. It is not intended to be exhaustive or to limit the present invention to the precise form disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is intended that the scope of the present invention be limited not with this detailed description, but rather by the claims appended hereto.

The invention claimed is:

1. A frequency synthesizer, comprising:
   a delay-locked loop comprising a delay chain having delay circuits, phase detection circuitry that generates a control signal for controlling delays of the delay circuits, and a multiplexer that receives output signals of at least two of the delay circuits, wherein the phase detection circuitry has a first input that receives a periodic input signal having a frequency, and the multiplexer outputs a feedback signal to a second input of the phase detection circuitry, wherein the delay-locked loop further comprises a delta sigma modulator that controls a duty cycle of the multiplexer using input signals that are indicative of a fractional number; and a frequency multiplier coupled to receive output signals of the delay circuits, the frequency multiplier generating a periodic output signal having an average frequency that is a product of the frequency of the periodic input signal multiplied by a non-integer fractional number when the frequency of the periodic input signal is constant.

2. The frequency synthesizer defined in claim 1 wherein the phase detection circuitry comprises a phase detector having an input coupled to receive the periodic input signal, a charge pump circuit coupled to an output of the phase detector, and a low pass filter coupled to an output of the charge pump circuit.

3. The frequency synthesizer defined in claim 1 wherein the multiplexer alternately switches between transmitting an output signal of a first one of the delay circuits to the second input of the phase detection circuitry and transmitting an output signal of a second one of the delay circuits to the second input of the phase detection circuitry.

4. A frequency synthesizer, comprising:
a delay-locked loop comprising a first delay chain having first delay circuits, first phase detection circuitry that generates a first control signal for controlling delays of the first delay circuits, a second delay circuit coupled to one of the first delay circuits, and second phase detection circuitry, wherein the first phase detection circuitry has a first input that receives a periodic input signal having a frequency; and
a frequency multiplier coupled to receive output signals of the first delay circuits, the frequency multiplier generating a periodic output signal having an average frequency that is a product of the frequency of the periodic input signal multiplied by a non-integer fractional number when the frequency of the periodic input signal is constant, wherein the second phase detection circuitry generates a second control signal that controls a delay of the second delay circuit to generate equal periods in the periodic output signal.

5. The frequency synthesizer defined in claim 4 wherein the second phase detection circuitry has a first input that is coupled to receive an intermediate signal from one of the first delay circuits, and wherein the second delay circuit is coupled to receive the periodic input signal.

6. The frequency synthesizer defined in claim 5 wherein the second phase detection circuitry has a second input that is coupled to receive the periodic input signal.

7. A delay-locked loop comprising:
first delay circuits, wherein one of the first delay circuits is coupled to receive a periodic input signal having a phase;
a first selector circuit having inputs that are coupled to receive output signals of at least two of the first delay circuits; and
first phase detection circuitry having a first input coupled to receive the periodic input signal, wherein the first phase detection circuitry generates a control signal that controls delays of the first delay circuits,
wherein a duty cycle of the first selector circuit alternately transmitting the output signals of the at least two first delay circuits to a second input of the first phase detection circuitry is controlled based on a fractional number to cause the period of the periodic input signal divided by a delay of one of the first delay circuits to equal a non-integer rational number when the phase of the periodic input signal is constant, and wherein the non-integer rational number is determined by the fractional number.

8. The delay-locked loop defined in claim 7 further comprising:
an edge combiner circuit coupled to receive output signals of the first delay circuits that is configured to generate a periodic output signal having a frequency that is a product of a frequency of the periodic input signal multiplied by a non-integer fractional number.

9. The delay-locked loop defined in claim 7 further comprising:
second delay circuits having delays that are controlled by the control signal;
a third delay circuit coupled to one of the second delay circuits and coupled to receive the periodic input signal; and
an edge combiner circuit coupled to receive output signals of the second delay circuits and an output signal of the third delay circuit,
wherein the edge combiner circuit is configured to generate a periodic output signal having a frequency that is a product of a frequency of the periodic input signal multiplied by a non-integer fractional number.

10. The delay-locked loop defined in claim 9 further comprising:
second phase detection circuitry having a first input coupled to receive the periodic input signal and a second input coupled to receive an intermediate signal from the second delay circuits,
wherein the second phase detection circuitry controls a delay of the third delay circuit to generate equal periods in the periodic output signal.

11. The delay-locked loop defined in claim 7 wherein the first phase detection circuitry comprises a phase detector, a charge pump circuit coupled to an output of the phase detector, and a low pass filter coupled to an output of the charge pump circuit.

12. The delay-locked loop defined in claim 7 further comprising:
a second selector circuit having a first input coupled to receive the periodic input signal;
second delay circuits coupled to an output of the second selector circuit and a second input of the second selector circuit, wherein the control signal generated by the first phase detection circuitry controls delays of the second delay circuits;
an edge combiner circuit coupled to receive output signals of the second delay circuits; and
a comparator circuit that controls the second selector circuit.

13. The delay-locked loop defined in claim 7 further comprising a delta sigma modulator that controls the duty cycle of the first selector circuit using input signals that are indicative of the fractional number.

14. A delay-locked loop comprising:
delay circuits, wherein one of the delay circuits is coupled to receive a periodic input signal having a phase;
a selector circuit having inputs that are coupled to receive output signals of at least two of the delay circuits;
phase detection circuitry having a first input coupled to receive the periodic input signal, wherein the phase detection circuitry generates a control signal that controls delays of the delay circuits, and wherein the selector circuit alternately transmits the output signals of the at least two delay circuits to a second input of the phase detection circuitry such that the period of the periodic input signal divided by a delay of one of the delay circuits equals a non-integer rational number when the phase of the periodic input signal is constant; and a delta sigma modulator coupled to a select input of the selector circuit that generates select signals indicative of a fractional number.

15. A method for generating a periodic output signal using a delay-locked loop, the method comprising:

generating a first control signal in response to a phase difference between a periodic input signal and a feedback signal using first phase detection circuitry;

controlling delays of first delay circuits in response to the first control signal;

alternately transmitting at least two output signals of at least two of the first delay circuits to an input of the first phase detection circuitry as the feedback signal using a multiplexer having a duty cycle that is controlled based on a fractional number to cause a period of the periodic input signal divided by a delay of one of the first delay circuits to equal a non-integer rational number when a phase of the periodic input signal is constant, wherein the non-integer rational number is determined by the fractional number; and generating a periodic output signal in response to output signals of the first delay circuits, the periodic output signal having an average frequency that is a product of a frequency of the periodic input signal multiplied by a non-integer fractional number when a frequency of the periodic input signal is constant.

16. The method defined in claim 15 wherein alternately transmitting at least two output signals of at least two of the first delay circuits to an input of the first phase detection circuitry as the feedback signal further comprises controlling the duty cycle of the multiplexer using a sigma delta modulator.

17. The method defined in claim 15 further comprising:
controlling delays of second delay circuits in response to the first control signal.

18. The method defined in claim 17 further comprising:
generating a second control signal using second phase detection circuitry that controls a delay of a third delay circuit to generate equal periods in the periodic output signal while the phase of the periodic input signal is constant, wherein the second delay circuits and the third delay circuit are coupled in series, and the third delay circuit receives the periodic input signal at an input.

19. The method defined in claim 18 further comprising:
providing the periodic input signal to a first input of the second phase detection circuitry; and
providing an intermediate signal from one of the second delay circuits to a second input of the second phase detection circuitry.

20. A delay-locked loop comprising:
a first delay chain comprising first delay circuits, the first delay chain receiving a periodic input signal at an input;
a second delay chain comprising second delay circuits;
a frequency multiplier that generates a periodic output signal in response to output signals of the second delay chain, the periodic output signal having a frequency that is a non-integer fractional value of a frequency of the periodic input signal;

first phase detection circuitry that receives the periodic input signal and a feedback signal from the first delay chain as inputs, wherein the first phase detection circuitry controls delays of the first and the second delay circuits; and a first multiplexer coupled to an input and an output of the second delay chain.

21. The delay-locked loop defined in claim 20 further comprising:
a comparator generating a comparison signal that controls the multiplexer; and
a counter generating count signals in response to the periodic input signal, wherein at least one of the count signals is provided to an input of the comparator.

22. The delay-locked loop defined in claim 20 further comprising:
a second multiplexer coupled to the first delay chain that outputs the feedback signal.

23. A delay-locked loop comprising:
a first delay chain comprising first delay circuits, the first delay chain receiving a periodic input signal at an input;
a second delay chain comprising second delay circuits;
a frequency multiplier that generates a periodic output signal in response to output signals of the second delay chain the periodic output signal having a frequency that is a non-integer fractional value of a frequency of the periodic input signal;

first phase detection circuitry that receives the periodic input signal and a feedback signal from the first delay chain as inputs wherein the first phase detection circuitry controls delays of the first and the second delay circuits; and second phase detection circuitry having a first input coupled to receive an intermediate signal from the second delay chain.

24. The delay-locked loop defined in claim 23 wherein the second phase detection circuitry controls a delay of a third delay circuit in the second delay chain to generate equal periods in the periodic output signal while a frequency of the periodic input signal is constant.

25. The delay-locked loop defined in claim 24 wherein the third delay circuit is coupled to one of the second delay circuits.

26. A method for generating a periodic output signal using a delay-locked loop, the method comprising:

generating a control signal in response to a phase difference between a periodic input signal and a feedback signal using first phase detection circuitry;

controlling delays of first delay circuits in a first delay chain in response to the control signal;

controlling delays of second delay circuits in a second delay chain in response to the control signal;

combining output signals of the second delay chain to generate a periodic output signal having a frequency that is a non-integer fractional value of a frequency of the periodic input signal when the frequency of the periodic input signal is constant; and alternately selecting the periodic input signal and one of the output signals of the second delay chain for transmission to an input of the second delay chain using a multiplexer.

27. The method defined in claim 26 further comprising:
alternately selecting at least two output signals of two of the first delay circuits for transmission to an input of the first phase detection circuitry as the feedback signal using a multiplexer.

28. The method defined in claim 27 further comprising:
controlling a delay of a third delay circuit in the second delay chain using second phase detection circuitry, the third delay circuit being coupled to one of the second delay circuits in the second delay chain.

29. The method defined in claim 28 wherein the third delay circuit has an input that receives the periodic input signal, and the second phase detection circuitry has a first input that receives the periodic input signal delayed by one-half of a period of the periodic input signal and a second input that receives an intermediate signal from the second delay chain.

30. The method defined in claim 26 further comprising:
comparing a count signal from a counter and a reference count signal to generate a comparison signal, the counter receiving the periodic input signal as an input; and
controlling the multiplexer using the comparison signal.

* * * * *